(12) United States Patent
Barwicz et al.

(10) Patent No.: US 7,482,277 B2
(45) Date of Patent: Jan. 27, 2009

(54) MULTILEVEL FABRICATION PROCESSING BY FUNCTIONAL REGROUPING OF MATERIAL DEPOSITION, LITHOGRAPHY, AND ETCHING

(75) Inventors: Tymon Barwicz, Cambridge, MA (US); Minghao Qi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 11/285,598

(22) Filed: Nov. 22, 2005

(65) Prior Publication Data

US 2006/0134905 A1    Jun. 22, 2006

Related U.S. Application Data

(60) Provisional application No. 60/630,679, filed on Nov. 23, 2004.

(51) Int. Cl.
*H01L 21/302* (2006.01)
(52) U.S. Cl. .............. 438/708; 438/717; 438/720; 438/736; 438/742
(58) Field of Classification Search ............. 438/708, 438/717, 720, 736, 742
See application file for complete search history.

(56) References Cited

U.S. PATENT DOCUMENTS

| 5,891,799 A | 4/1999 | Tsui |
| 5,995,285 A * | 11/1999 | Unno ............... 359/565 |
| 6,194,128 B1 | 2/2001 | Tao et al. |
| 6,599,830 B2 | 7/2003 | Furusawa et al. |
| 6,673,719 B2 | 1/2004 | Ho |
| 6,696,222 B2 | 2/2004 | Hsue et al. |
| 6,730,610 B1 | 5/2004 | Sun et al. |
| 6,852,640 B2 | 2/2005 | Gutsche |
| 6,893,954 B2 | 5/2005 | Maekawa |
| 2002/0060297 A1 * | 5/2002 | Konishi et al. ........ 250/492.1 |
| 2002/0187629 A1 | 12/2002 | Huang et al. |
| 2002/0192595 A1 | 12/2002 | Otoguro et al. |
| 2003/0044725 A1 | 3/2003 | Hsue et al. |
| 2003/0071542 A1 * | 4/2003 | Satoh et al. ............ 310/367 |
| 2003/0207207 A1 | 11/2003 | Li |
| 2004/0157444 A1 * | 8/2004 | Chiu et al. ............ 438/689 |
| 2004/0161918 A1 | 8/2004 | Yun |
| 2005/0079727 A1 | 4/2005 | Zhang et al. |

FOREIGN PATENT DOCUMENTS

| EP | 1246239 | 3/2002 |
| WO | WO 03/085724 | 10/2003 |
| WO | WO 03085429 A1 * | 10/2003 |

* cited by examiner

*Primary Examiner*—Binh X Tran
(74) *Attorney, Agent, or Firm*—Gauthier & Connors LLP

(57) ABSTRACT

A method of multilevel microfabrication processing is provided. The method includes providing a planar substrate that comprises one or more material layers. A first hardmask layer placed on top of the substrate is patterned into the lithographic pattern desired for the top lithographic layer. Subsequent hardmask layers are patterned until the number of hardmask layers equals the number of lithographic layers desired. The method includes etching into the substrate and stripping the top hardmask layer. Furthermore, the method includes alternating etching into the substrate and stripping the subsequent hardmask layers until the bottom hardmask layer is stripped.

15 Claims, 9 Drawing Sheets

MULTILEVEL FABRICATION PROCESSING BY FUNCTIONAL REGROUPING OF MATERIAL DEPOSITION, LITHOGRAPHY, AND ETCHING

PRIORITY INFORMATION

This application claims priority from provisional application Ser. No. 60/630,679 filed Nov. 23, 2004, which is incorporated herein by reference in its entirety.

BACKGROUND OF THE INVENTION

The invention relates to the field of microfabrication and nanofabrication processing and, in particular, to multilevel processing.

Multilevel processing has become a requirement for almost all microfabricated and nanofabricated devices. Multilevel processing relates to the formation of a plurality of lithographic layers. It generally involves successive material deposition, aligned lithography, etching, and planarization steps. Each lithographic layer requires a separate material deposition step, which has to be immediately followed by lithography, patterning, and planarization. These steps are then repeated for each lithographic layer until the desired microstructure is formed. This standard multilevel process has several drawbacks that will now be considered.

First, planarization is problematic as it is typically the yield-limiting step. In addition, it is costly and may generate particles that can never be completely removed. Second, all the abovementioned fabrication steps have different contamination requirements. If one keeps alternating from one type of process to the next, all the processes have to reach the cleanliness standard of the most demanding step, typically material deposition. In some cases, this may be impossible to achieve so the application of the standard multilevel fabrication technique may be prohibited entirely. Finally, the number of fabrication steps is high and contributes to making the process costly.

SUMMARY OF THE INVENTION

According to one aspect of the invention, there is provided a method of multilevel microfabrication processing. The method includes providing a planar substrate that comprises one or more material layers. A first hardmask layer placed on top of the substrate is patterned into the lithographic pattern desired for the top lithographic layer. Subsequent hardmask layers are patterned until the number of hardmask layers equals the number of lithographic layers desired. The method includes etching into the substrate and stripping the top hardmask layer. Furthermore, the method includes alternating etching into the substrate and stripping the subsequent hardmask layers until the bottom hardmask layer is stripped.

According to another aspect of the invention, there is provided a method of forming a multilayered upturned structure. The method includes providing cladding structure. A first hardmask layer placed on top of the cladding structure is patterned into the lithographic pattern desired for the top lithographic layer. Subsequent hardmask layers are patterned until the number of hardmask layers equals the number of lithographic layers desired. The method includes etching into the cladding structure and stripping the top hardmask layer. Furthermore, the method includes alternating etching into the cladding structure and stripping the subsequent hardmask layers until the bottom hardmask layer is stripped.

DETAILED DESCRIPTION OF THE INVENTION

Figure 1A:
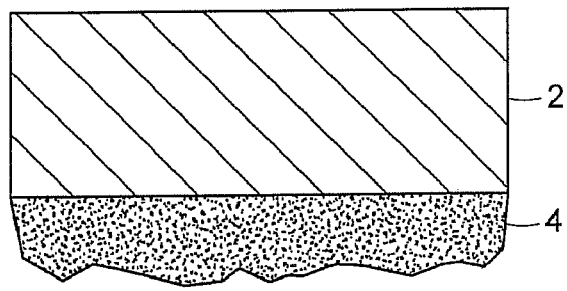
FIGS. 1A-1H illustrates the invention by applying it to the fabrication of a three-layer structure.
Figure 1B:
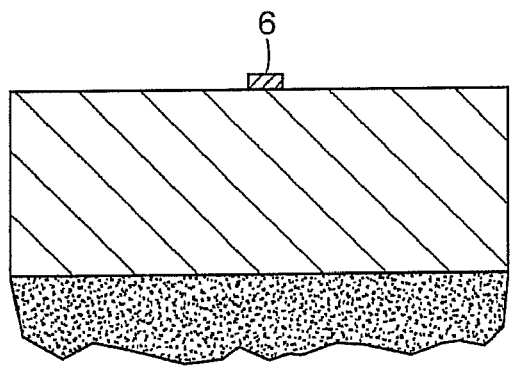
Figure 1C:
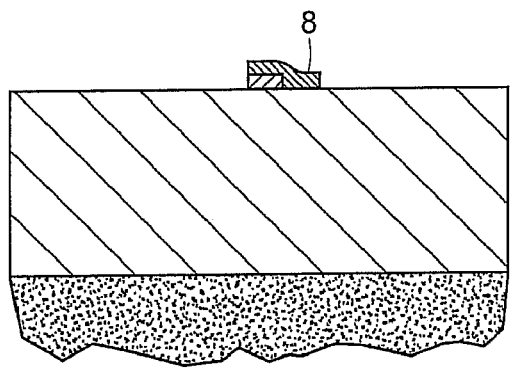
Figure 1D:
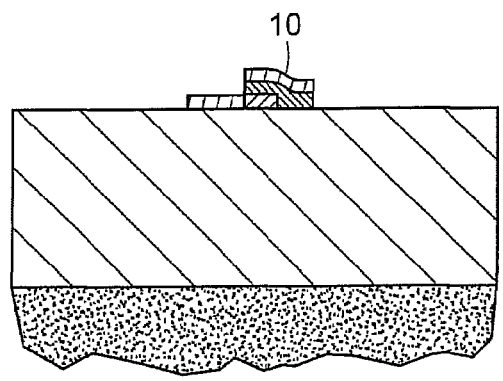
Figure 1E:
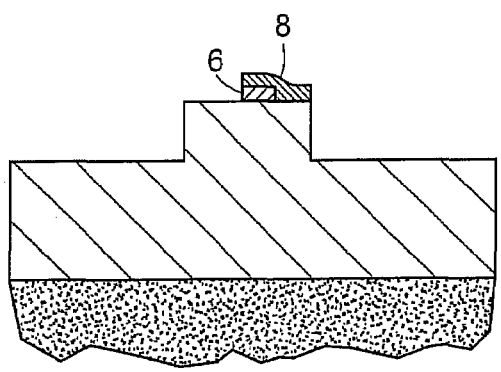
Figure 1F:
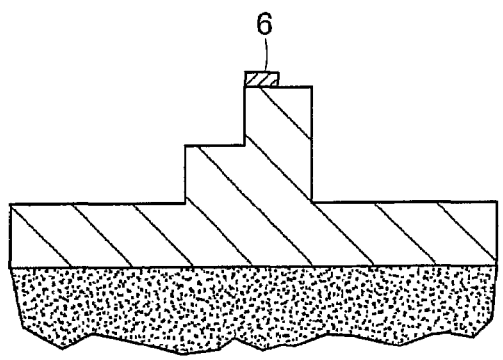
Figure 1G:
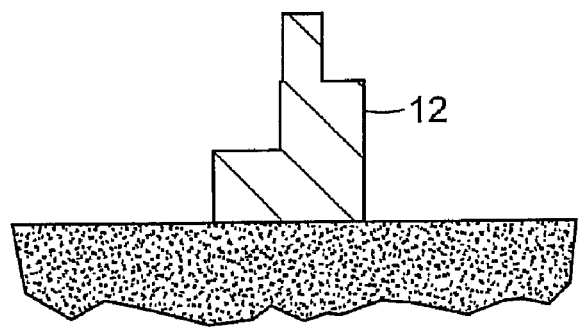
Figure 1H:
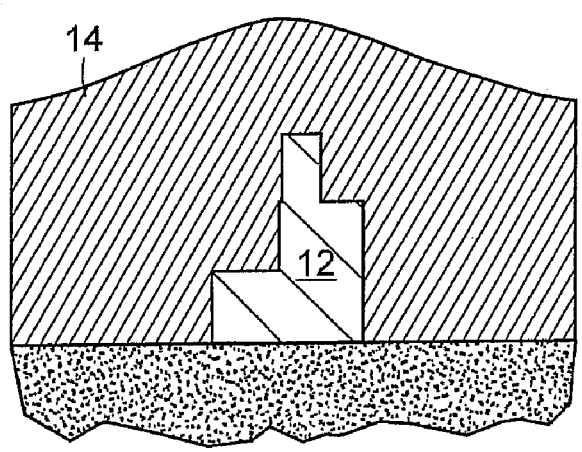

The invention is an improved and simplified multilevel fabrication technique that removes the need for planarization steps. It regroups processes of the same type. All the required material deposition is done first; all the needed lithography is done second; and all the needed patterning is done third. This is illustrated in FIGS. 1A-1H by presenting the fabrication a three-layer structure. FIG. 1A shows the deposition of a material 2 on a wafer 4. FIGS. 1B-1D show the formation of a first 6, second 8, and third 10 hardmasks. FIG. 1E illustrates a first etch and the removal of one of the hardmask 6. FIGS. 1F and 1G illustrate a second and third etch, forming an etched structure 12, and successive removal of the remaining hardmasks 6 and 8. FIG. 1H demonstrates the deposition of cladding materials 14 on the remaining etched structure 12. In this embodiment, the last hard mask can be replaced by a resist mask. Moreover, the deposition of material 2 and of cladding materials 14 can be omitted in practice.

The technique uses a plurality of selective hardmasks, for example, one can be selectively removed without affecting the other. The material choices for the plurality of hardmasks are numerous and depend on the material to be patterned and on contamination issues. The plurality of hardmask materials have to be chosen so one is able to remove a hardmask selectively without removing the one just below it. Moreover, the hardmask materials must withstand the patterning steps employed. The inventive technique is particularly useful for fabrication of multilevel structures where every successive layer is patterned into a subgroup of the previous layer. Such structures were used in the illustrations presented in FIGS. 1A-1H. Note the hardmasks described can include materials such as silicon dioxide, diamond-like carbon, nickel, chromium, other metals, or similar materials.

Any number of layers may be patterned. In all figures, the layer to be patterned is represented as a single material for simplicity. However, the present invention is not limited to patterning a single material and can be applied with no modification to pattern complex material stacks as well. The advantages of the invention over the standard multilevel fabrication technique are: planarization is avoided, lowering the cost of fabrication, reducing the particle-count, and improving the yield; the number of fabrication steps is smaller making the fabrication quicker and cheaper; cleanliness requirements are eased, which is particularly important when some of the processing steps are done in experimental rather than manufacturing facilities; and all of the lithography is done on the same level making the alignment easier and more accurate. Moreover, in the standard process, special care has to be taken to ensure that the alignment marks are visible and problems arise when some of the materials used are opaque. This is not a concern for the inventive technique.

Figure 2A:
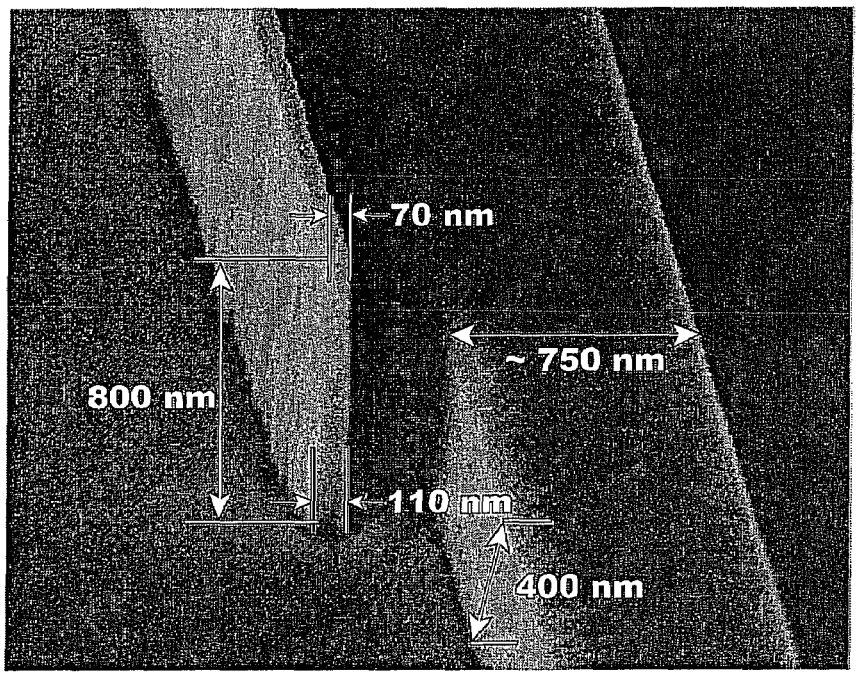
FIGS. 2A-2B show the experimental demonstration of the invention through the fabrication of a two-layer optical polarization splitter and rotator.
Figure 2B:
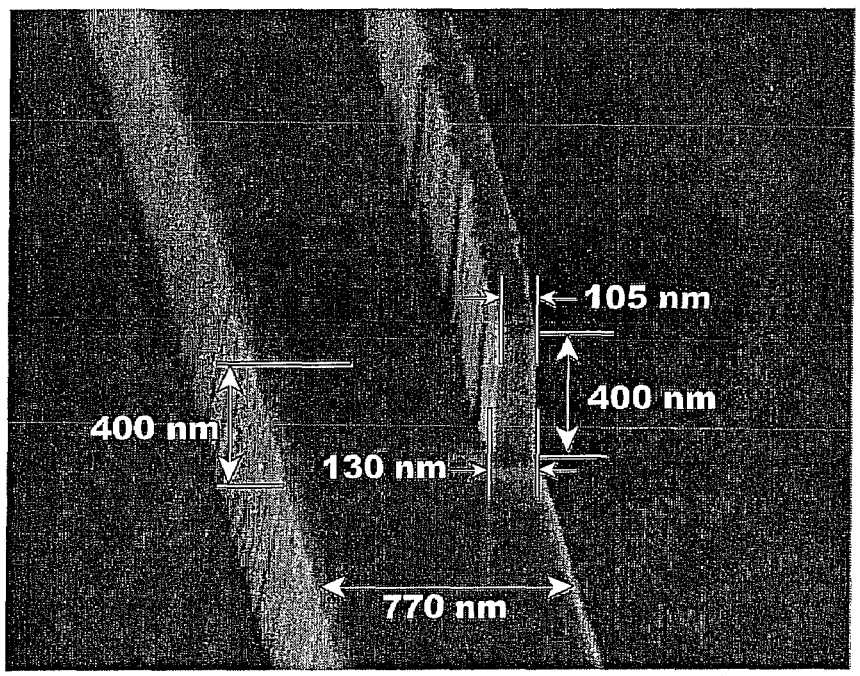

The invention was used to successfully fabricate a two-layer optical polarization splitter and rotator. FIGS. 2A-2B shows electron micrographs of a fabricated two-layer optical polarization splitter and rotator. Two selective hardmask materials are used to form the device, and they comprise nickel and chromium. The sidewall roughness visible in the electron micrographs is due to insufficiently optimized lithography steps and not to the invention. The etch depths were accurately controlled by successive etching steps and profilometer measurements. Reactive-ion etching without a mask was shown not to alter the shape of the structure. In particular, cornering is not observed if excessive etching power is not used. The optical properties of the fabricated devices matched the rigorous optical numerical-simulations and further validated the invented fabrication technique.

Figure 3A:
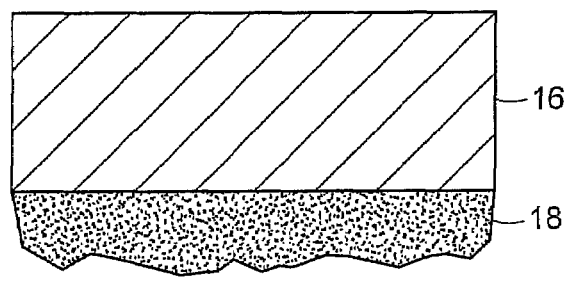
FIGS. 3A-3I illustrate the upturned invention by applying it to the fabrication of an upturned three-layer structure.
Figure 3B:
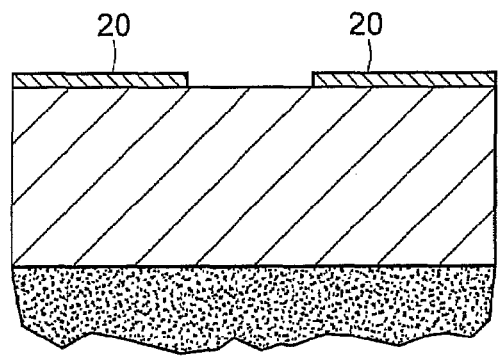
Figure 3C:
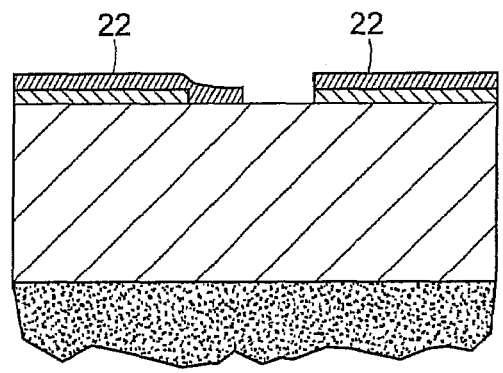
Figure 3D:
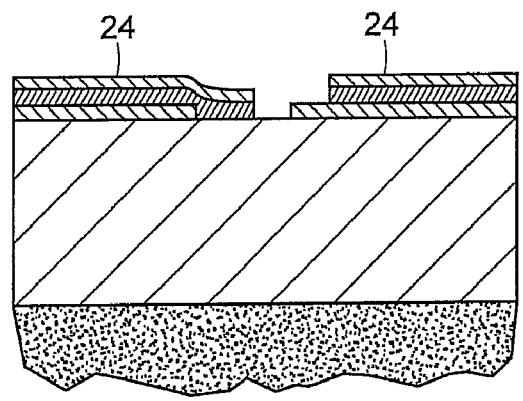
Figure 3E:
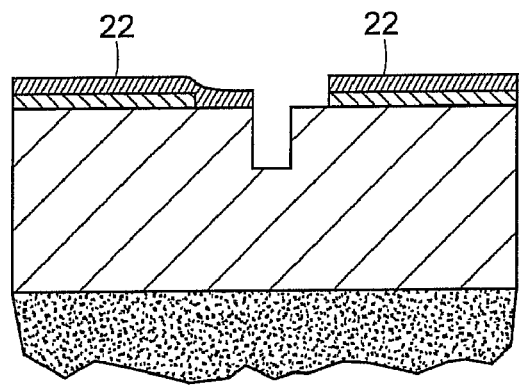
Figure 3F:
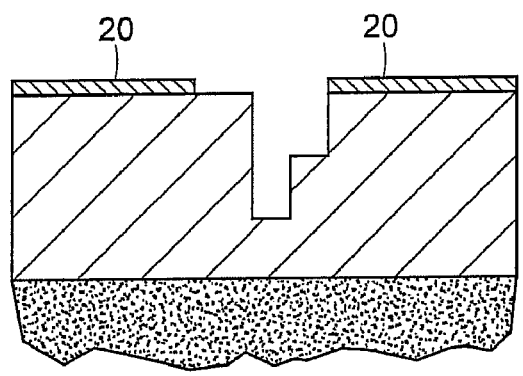
Figure 3G:
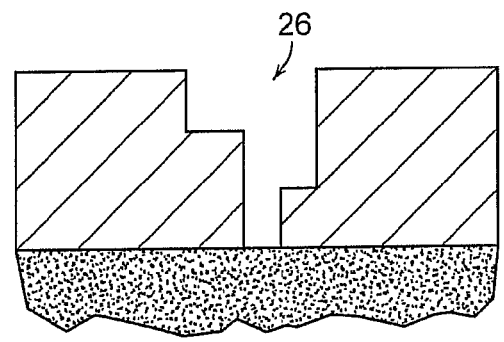
Figure 3H:
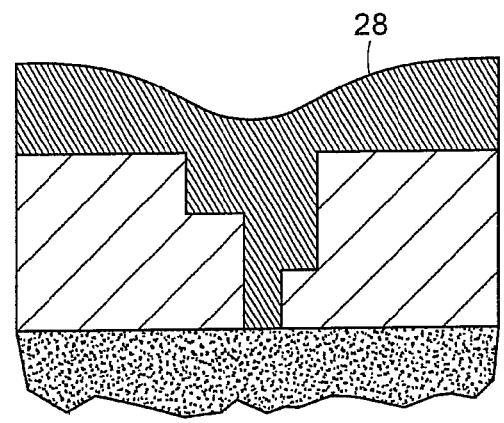
Figure 3I:
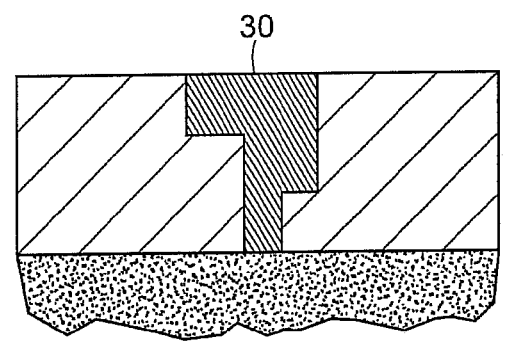

The invention can also be applied to upturned structures as shown in FIGS. 3A-3I. The upturned invention is particularly useful for structures where each layer is patterned into a subgroup of the subsequent layer. FIG. 3A shows the deposition of a cladding material 16 on a substrate 18. FIGS. 3B-3D show the formation of a first 20, second 22, and third 24 hardmasks. FIG. 3E illustrates a first etch and removal of one of the hardmask 24. FIGS. 3F and 3G illustrate a second and third etch of the cladding material, forming an etched structure 26, and successive removal of the remaining hardmasks 20 and 22. FIG. 3H demonstrates the deposition of a material 28 on the remaining etched structure 26. FIG. 3I illustrates the planaratization of the material 28 to form an upturned structured.

Figure 4A:
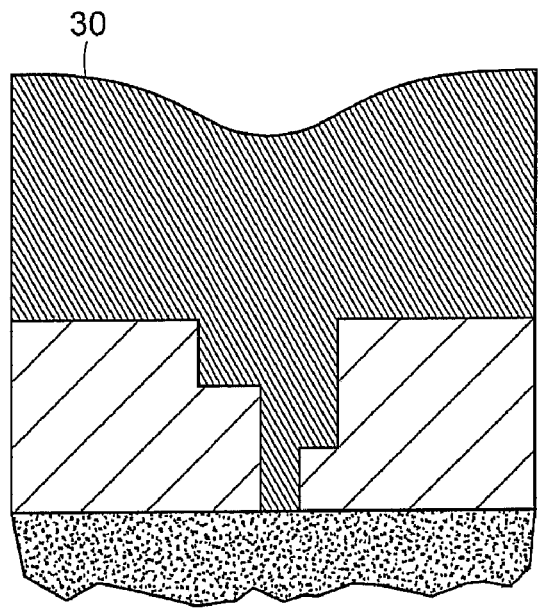
FIGS. 4A-4C illustrate the combination of the techniques used by the invention.
Figure 4B:
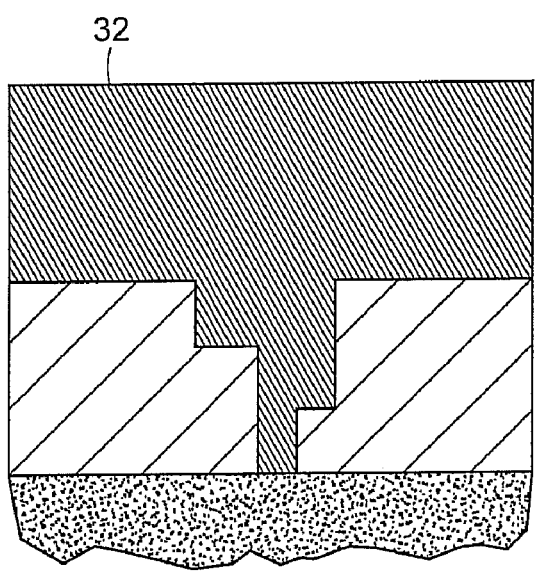
Figure 4C:
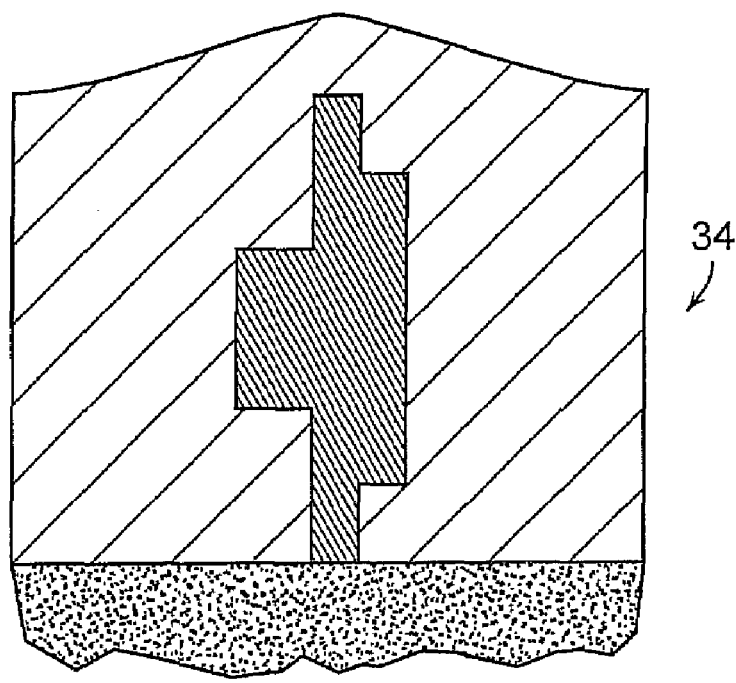

As shown in FIGS. 4A-4C, the techniques of FIGS. 1A-1G can be combined with the techniques of FIGS. 3A-3H to create a wide variety of structures. The techniques of FIGS. 3A-3H are performed first. FIG. 4A represents the same step as FIG. 3H but with a thicker core material. FIG. 4B illustrates the planaratization of the thick core material 30 to become 32. FIG. 4C illustrates the application of the techniques of FIGS. 1A-1G to pattern the thick core material 32 to result in a structure 34 exhibiting both an upturn structure and a three-layer structure such as the one shown in FIGS. 1A-1G. Note that the planarization step illustrated at FIG. 4B can be omitted if one applies a self-planarizing deposition step such as spin-on processing or sputtering with a strong re-sputtering coefficient.

Dual-damascene processes are used in back-end microelectronic processing. These include patterning a given intermetal dielectric layer twice to form a two-layer structure where the bottom-layer pattern is a sub-set of the top-layer pattern. Note that dual-damascene processes are only defined for two-layer structures while the present invention is defined for an arbitrary number of layers. Most of the dual-damascene processes alternate between a lithography and an etching step. These suffer from problems associated with performing lithography on non-planarized surfaces. Moreover, almost all dual-damascene processes require etch stops that impose considerable limitations on the types of materials that can be etched. For certain applications, such as microphotonic devices, etch stops are either undesirable or incompatible with the device functionality.

Some of the dual damascene processes use hardmasks. These, however, require the hardmask to be precisely etched using the second hardmask as a mask. This significantly constrains the possible hardmask materials one can use. In contrast, the invention only requires one to be able to strip one hardmask without damaging the other. This is a much less stringent requirement and allows a wide range of hardmask materials to be used. This strong improvement originates from the unique reversed ordering of the hardmasks reported in the invention (the first hardmask created corresponds to the pattern of the last layer and the last hardmask created corresponds to the pattern of the first layer).

Multiple etching steps and multilayer hardmasks are prior art. These are mostly used for patterning material stacks (plurality of materials stacked in a planar fashion). When the materials composing a material stack require different etching chemistries to be patterned, it is possible that a multistep etching process may be found useful. When a multistep etching process is used, it is possible that a multilayer hardmask may be found useful as it may be difficult to find a hardmask material that will resist to all the etching chemistries required to pattern the material stack.

The distinction between the invention and the multiple etching steps and multilayer hardmasks is that the multiple etching steps and multilayer hardmasks describe one lithographic layer patterning a plurality of material layers while the present invention describes a plurality of lithographic layers patterning either a single material or a plurality of materials. The present invention deals with improving the fabrication process when a plurality of lithographic layers is used. Each lithographic layer may be used to pattern a single material layer or a plurality of material layers. Also, the invention can be used in conjunction with inventions related to patterning of a single lithographic layer.

Although the present invention has been shown and described with respect to several preferred embodiments thereof, various changes, omissions and additions to the form and detail thereof, may be made therein, without departing from the spirit and scope of the invention.

What is claimed is:

1. A method of multilevel microfabrication processing for a plurality of lithographic layers comprising:

providing a planar substrate that comprises one or more material layers;

adding a first patterned hardmask layer placed on top of the substrate and patterned into the lithographic pattern desired for the top lithographic layer;

adding subsequent patterned hardmask layers until the number of hardmask layers equals the number of lithographic layers desired; the second-from-the-bottom hardmask layer being patterned into the lithographic pattern desired in the second-from-the-top lithographic layer; if the number of lithographic layers desired is at least three, the third-from-the-bottom hardmask layer being patterned into the pattern desired in the third-from-the-top lithographic layer; if the number of lithographic layers desired is at least four, the fourth-from-the-bottom hardmask layer being patterned into the pattern desired in the fourth-from-the-top lithographic layer; for any number of lithographic layers, this correspondence is continued until the pattern of the top hardmask layer corresponds to the pattern desired in the bottom lithographic layer;

etching into the substrate followed by completely removing the top hardmask layer once all desired hardmask layers are added; and alternating etching into the substrate and completely removing a hardmask layer until the bottom hardmask layer is removed.

2. The method of claim 1, wherein the last of said subsequent patterned hardmask layers is replaced by defining a resist mask.

3. The method of claim 1, wherein the patterned material left standing in each lithographic layer is a subgroup of the patterned material left standing in every lithographic layer below the said lithographic layer.

4. The method of claim 3 further comprising depositing of one or more additional material layers with or without subsequent planarization.

5. The method of claim 4, wherein said additional material layer is used to further form a multilayered upturned structure by:
- adding a first patterned hardmask layer placed on top of the one or more additional material layers into the lithographic pattern desired for the top lithographic layer;
- adding subsequent patterned hardmask layers until the number of hardmask layers equals the number of lithographic layers desired;
- etching into the one or more additional material layers followed by completely removing the top hardmask layer once all desired hardmask layers have been added; and
- alternating etching into the one or more additional material layers and completely removing a said subsequent hardmask layers until the bottom hardmask layer is removed.

6. The method of claim 1, wherein the said subsequent patterned hardmask layers are each formed from one of a plurality of materials that allows a hardmask layer to be removed without damaging the material forming the hardmask layer just below.

7. The method of claim 6, wherein at least two of said hardmask layers comprise nickel and chromium.

8. The method of claim 6, wherein at least two of said hardmask layers comprise silicon oxide and diamond-like carbon.

9. The method of claim 6, wherein at least two of said hardmask layers comprise diamond-like carbon and a metal.

10. A method of forming a multilayered upturned structure with a plurality of lithographic layers comprising:
- providing a cladding structure;
- adding a first patterned hardmask layer placed on top of the cladding structure and patterned into the lithographic pattern desired for the top lithographic layer;
- adding subsequent patterned hardmask layers until the number of hardmask layers equals the number of lithographic layers desired; the second-from-the-bottom hardmask layer being patterned into the lithographic pattern desired in the second-from-the-top lithographic layer; if the number of lithographic layers desired is at least three, the third-from-the-bottom hardmask layer being patterned into the pattern desired in the third-from-the-top lithographic layer; if the number of lithographic layers desired is at least four, the fourth-from-the-bottom hardmask layer being patterned into the pattern desired in the fourth-from-the-top lithographic layer; for any number of lithographic layers, this correspondence is continued until the pattern of the top hardmask layer corresponds to the pattern desired in the bottom lithographic layer;
- etching into the cladding structure followed by completely removing the top hardmask layer once all desired hardmask layers are added; and
- alternating etching into the cladding structure and completely removing a hardmask layer until the bottom hardmask layer is removed.

11. The method of claim 10, wherein the last of said subsequent hardmasks is replaced by defining a resist mask.

12. The method of claim 10, wherein said subsequent patterned hardmask layers are each formed from one of a plurality of materials that allows a hardmask layer to be removed without damaging the material forming the hardmask layer just below.

13. The method of claim 12, wherein at least two of said hardmask layers comprise nickel and chromium.

14. The method of claim 12, wherein at least two of said hardmask layers comprise silicon oxide and diamond-like carbon.

15. The method of claim 12, wherein at least two of said hardmask layers comprise diamond-like carbon and a metal.

* * * * *